(12) United States Patent
Tanaka (10) Patent No.: US 8,222,951 B2
(45) Date of Patent: Jul. 17, 2012

(54) SEMICONDUCTOR DEVICE AND BIAS GENERATION CIRCUIT

(75) Inventor: Motoyuki Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/567,964

(22) Filed: Sep. 28, 2009

(65) Prior Publication Data

US 2010/0013550 A1 Jan. 21, 2010

Related U.S. Application Data

(63) Continuation of application No. PCT/JP2007/056838, filed on Mar. 29, 2007.

(51) Int. Cl.
*H03K 3/01* (2006.01)
(52) U.S. Cl. .................. 327/534; 327/541
(58) Field of Classification Search .................. 327/534, 327/544, 540, 541
See application file for complete search history.

(56) References Cited

U.S. PATENT DOCUMENTS

| | | | | |
|---|---|---|---|---|
| 6,333,571 | B1 * | 12/2001 | Teraoka et al. | 307/125 |
| 6,737,909 | B2 * | 5/2004 | Jaussi et al. | 327/541 |
| 6,741,098 | B2 * | 5/2004 | Takahashi et al. | 326/81 |
| 6,831,483 | B2 * | 12/2004 | Shimazaki et al. | 326/121 |
| 7,317,346 | B2 | 1/2008 | Chu et al. | |
| 7,492,215 | B2 * | 2/2009 | Lee et al. | 327/544 |
| 7,598,794 | B1 * | 10/2009 | Stansell et al. | 327/534 |
| 7,639,067 | B1 * | 12/2009 | Perisetty | 327/537 |
| 2002/0125934 | A1 | 9/2002 | Wu et al. | |
| 2003/0210089 | A1 * | 11/2003 | Tanzawa et al. | 327/536 |
| 2006/0145749 | A1 | 7/2006 | Bhattacharya et al. | |
| 2006/0285418 | A1 | 12/2006 | Aoki | |

FOREIGN PATENT DOCUMENTS

| | | |
|---|---|---|
| JP | 2001-35161 | 2/2001 |
| JP | 2006-351633 | 12/2006 |

OTHER PUBLICATIONS

English language International Search Report mailed Jul. 10, 2007 for corresponding International Application No. PCT/JP2007/056838.
"Extended European Search Report", mailed by EPO and corresponding to European application No. 07740276.6 on May 19, 2011.

* cited by examiner

*Primary Examiner* — Quan Tra
(74) *Attorney, Agent, or Firm* — Fujitsu Patent Center (57) ABSTRACT

A first power supply voltage input section can input a first power supply voltage, a second power supply voltage input section can input a second power supply voltage, a regulator circuit generates a back bias voltage on the basis of the second power supply voltage, and an output section can output the back bias voltage generated by the regulator circuit as an output voltage. A substrate bias can be generated with low power consumption, and the circuit scale can be reduced.

14 Claims, 13 Drawing Sheets

| No. | TERMINAL NAME | ATTRIBUTE | | | TERMINAL OUTLINE |
|---|---|---|---|---|---|
| | | I/O | LEVEL | VALID POLARITY | |
| 1 | VDD | | DC | | MACRO SUPPLY POWER SOURCE: +1.0V |
| 2 | VDD2 | | DC | | MACRO SUPPLY POWER SOURCE: +1.8V |
| 3 | VSS | | DC | | MACRO SUPPLY POWER SOURCE: VSS |
| 4 | VBP1 | OUT | DC | + | MACRO VBS OUTPUT: +1.0V(=VDD) TO +1.5V |
| 5 | FF | IN | DC | − | "−FF" SIGNAL OF TEST SYSTEM I/O SIGNALS |
| 6 | POR | IN | DC | − | "−RESET" SIGNAL OF TEST SYSTEM I/O SIGNALS |
| 7 | SM | IN | DC | − | "−SM" SIGNAL OF TEST SYSTEM I/O SIGNALS |
| 8 | TM | IN | DC | − | "−TM" SIGNAL OF TEST SYSTEM I/O SIGNALS |
| 9 | BP0 | IN | DC | + | VBS OUTPUT SETTING BIT 0 |
| 10 | BP1 | IN | DC | + | VBS OUTPUT SETTING BIT 1 |
| 11 | BP2 | IN | DC | + | VBS OUTPUT SETTING BIT 2 |
| 12 | BP3 | IN | DC | + | VBS OUTPUT SETTING BIT 3 |
| 13 | BP4 | IN | DC | + | VBS OUTPUT SETTING BIT 4 |
| 14 | GEP | IN | DC | + | ENABLE VBS GENERATOR "1" = VBS MODE (REGULATOR CIRCUIT ON, SHORT CIRCUIT OFF) "0" = SHORT MODE (REGULATOR CIRCUIT OFF, SHORT CIRCUIT ON) |

FIG. 5

| VBS[V] | BP4 | BP3 | BP2 | BP1 | BP0 | GEP |
|---|---|---|---|---|---|---|
| +1.1 | 0 | 0 | 0 | 0 | 1 | 1 |
| +1.2 | 0 | 0 | 0 | 1 | 1 | 1 |
| +1.3 | 0 | 0 | 1 | 1 | 1 | 1 |
| +1.4 | 0 | 1 | 1 | 1 | 1 | 1 |
| +1.5 | 1 | 1 | 1 | 1 | 1 | 1 |

FIG. 6

| VBS[V] | BP4 | BP3 | BP2 | BP1 | BP0 | GEP |
|---|---|---|---|---|---|---|
| +1.0 | 0 | 0 | 0 | 0 | 0 | 1 |

| VBS[V] | BP4 | BP3 | BP2 | BP1 | BP0 | GEP |
|---|---|---|---|---|---|---|
| +1.0 | 0 | 0 | 0 | 0 | 0 | 0 |

SEMICONDUCTOR DEVICE AND BIAS GENERATION CIRCUIT

CROSS-REFERENCE TO RELATED APPLICATION

This application is a continuation Application of a PCT international application No. PCT/JP2007/056838 filed on Mar. 29, 2007 in Japan, the entire contents of which are incorporated by reference.

FIELD

The embodiment discussed herein relates to a technique for generating a back bias voltage in a semiconductor device having a logic circuit.

BACKGROUND

Recent progress in minimization of transistor causes a steady increase in not only leak current of the transistor but also power consumption of LSI (Large Scale Integrated circuit).

As a method for decreasing the leakage current of transistor, known is the back bias control technique that applies a back bias (reverse bias, substrate bias) voltage to a substrate of the transistor.

In a known substrate bias generation circuit generating the back bias voltage, the back bias voltage is generated by a boost charge pump of clock application type.

Figure 12:
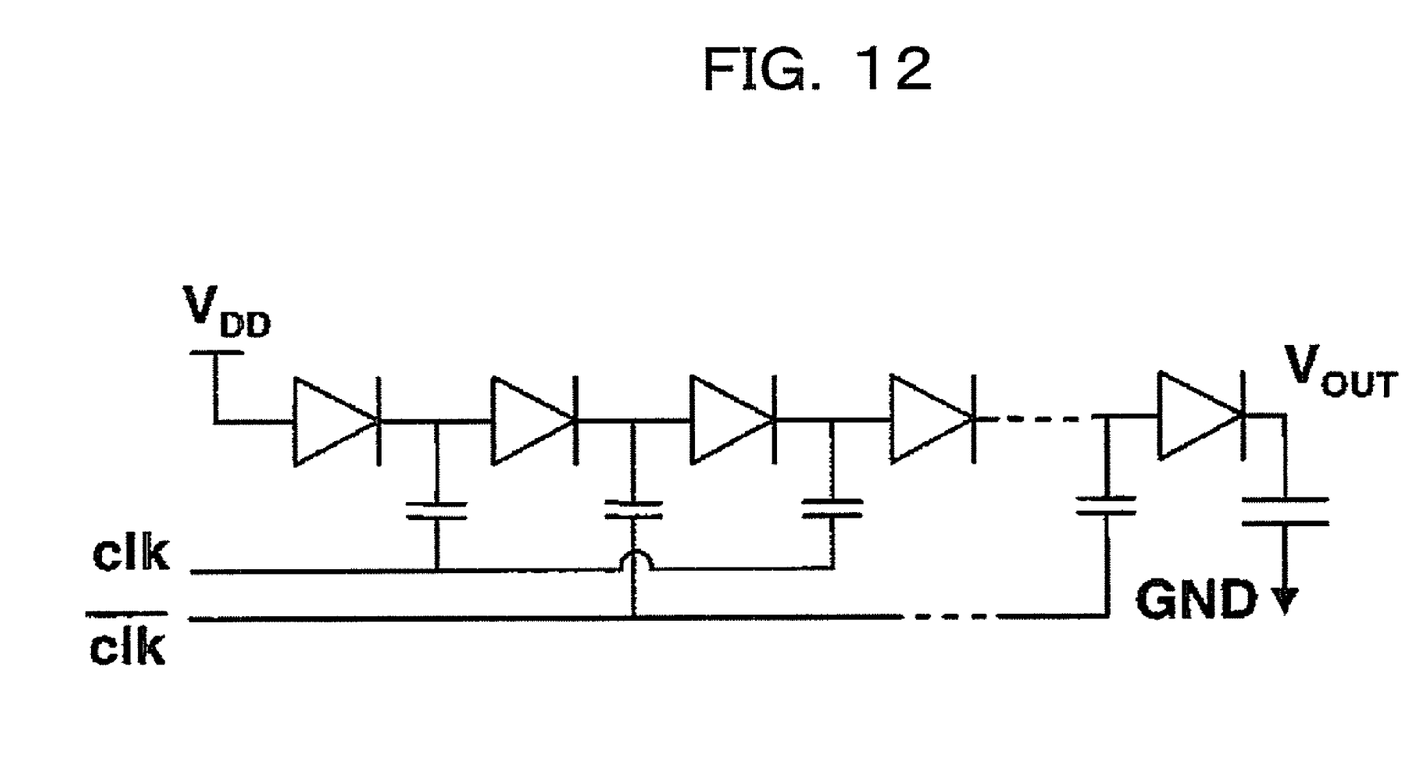
FIG. 12 is a diagram illustrating an example of configuration of a boost charge pump of clock application type.
Figure 13:
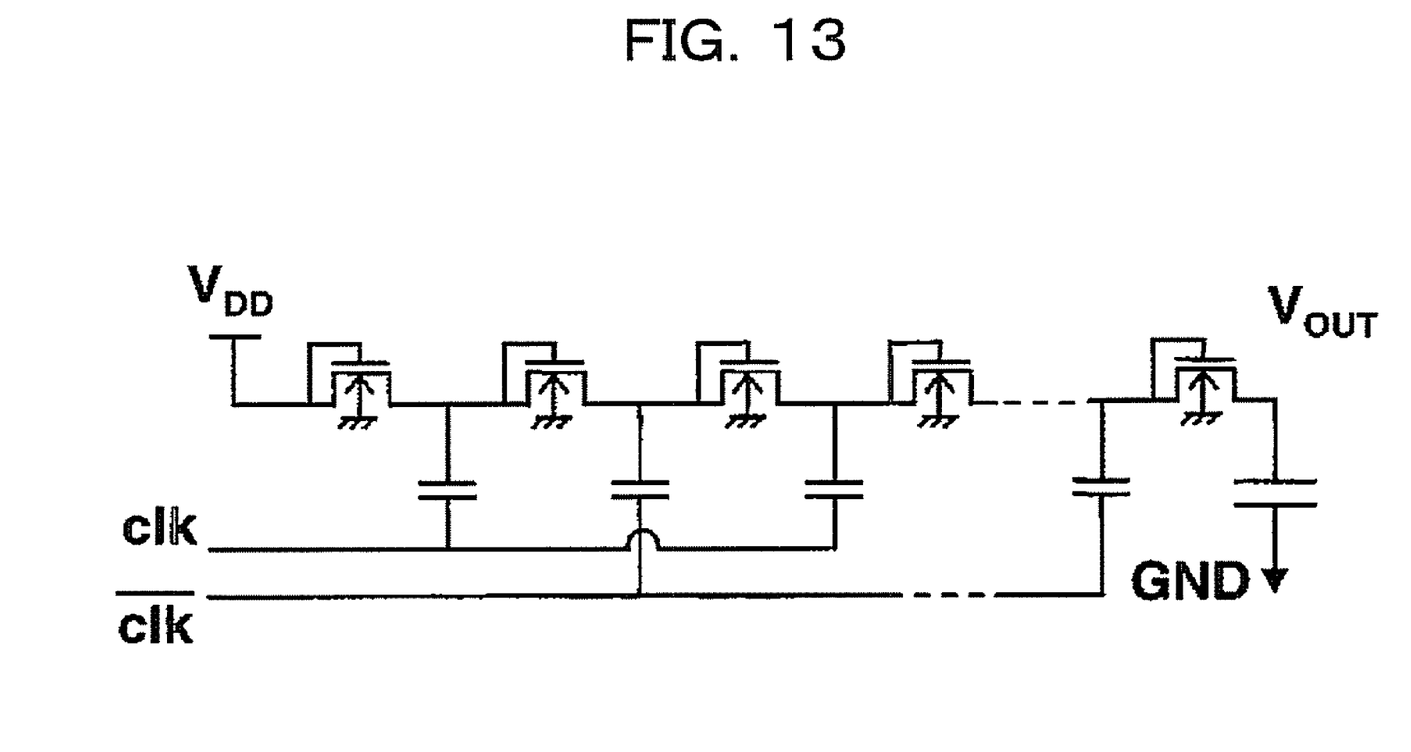
FIG. 13 is a diagram depicting an example of another boost charge pump of clock application type.

FIGS. 12 and 13 are diagrams illustrating examples of constitution of the boost charge pump of clock application type. FIG. 12 is a diagram illustrating an example of diode charge pump, whereas FIG. 13 is a diagram illustrating an example of Dickson type charge pump.

In Patent Document 1 below, there is disclosed a semiconductor integrated circuit apparatus having a charge pump circuit driven by a power supply voltage, wherein a generated negative voltage is used as the back bias voltage.

Patent Document 1: Japanese Laid-Open Patent Publication No. 2001-35161

When the scale of LSI is increased, the substrate leakage current of transistor is increased and the charge amount that would be applied is increased. However, since the clock application type boost charge pump described above drives the capacitors to generate the charge, it is desired to increase the number of the circuits or increase the capacity of the capacitor or the clock frequency, which causes an increase in circuit scale or in power consumption of the circuit.

As this, the known LSI having a clock application type charge pump has a problem that the circuit scale increases or the power consumption of the circuit increases.

SUMMARY

To solve the above problem, the present embodiment provides a semiconductor device having a first operation section operable at a first power supply voltage and a second operation section operable at a second power supply voltage differing from the first power supply voltage, comprising a bias generation circuit comprising a first power supply voltage input section operable to input the first power supply voltage, a second power supply voltage input section operable to input the second power supply voltage, a regulator circuit that generates the back bias voltage on the basis of the second power supply voltage, and an output section operable to output the back bias voltage generated by the regulator circuit as an output voltage.

The present embodiment also provides a bias generation circuit provided in a semiconductor device and generating a back bias voltage to be applied to a transistor in the semiconductor device, comprising a first power supply voltage input section operable to input a first power supply voltage, a second power supply voltage input section operable to input a second power supply voltage differing from the first power supply voltage, a regulator circuit that generates the back bias voltage on the basis of the second power supply voltage, and an output section operable to output the back bias voltage generated by the regulator circuit as an output voltage.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT

Hereinafter, the present embodiment will be described with reference to the drawings.

Figure 1:
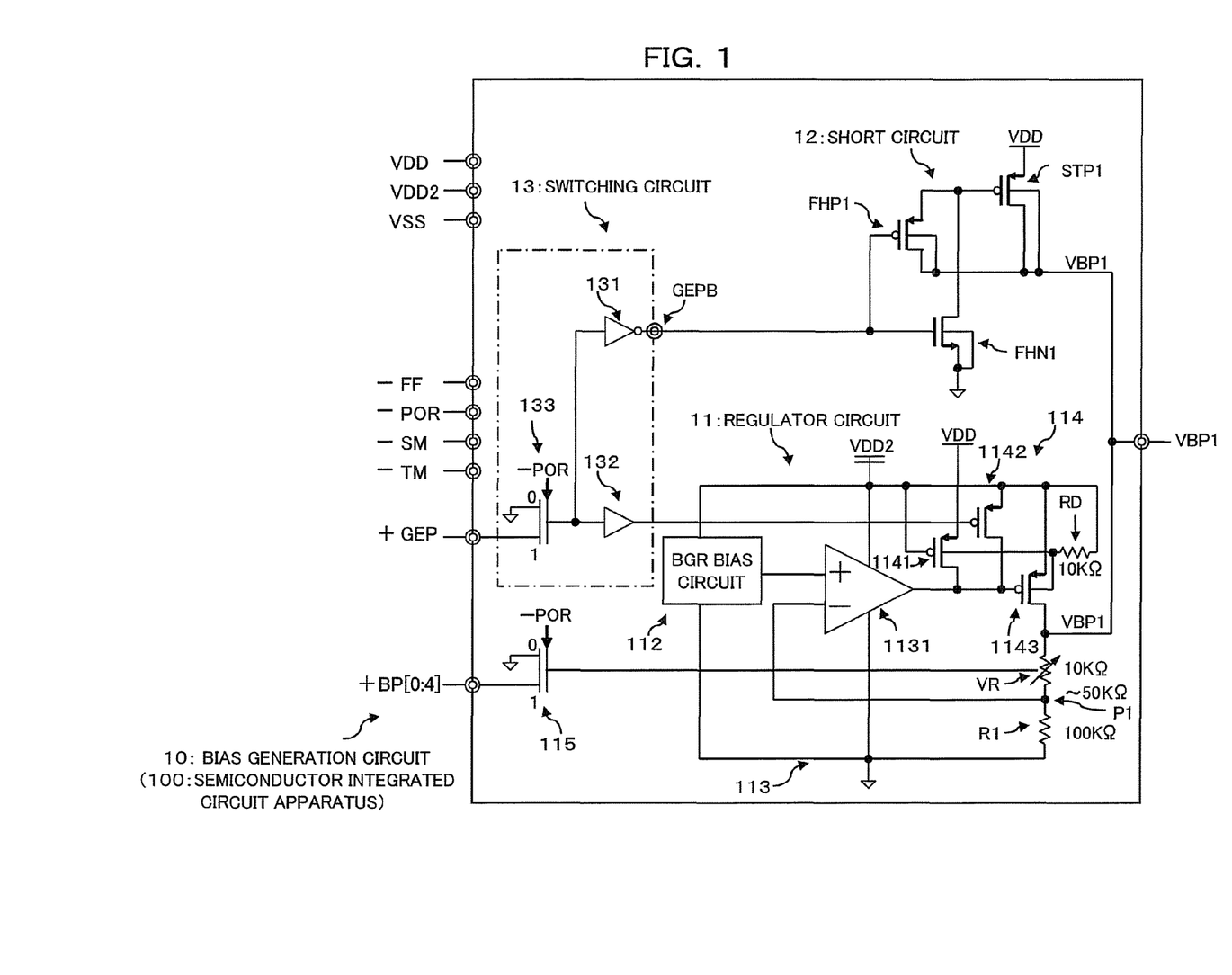
FIG. 1 is a diagram illustrating a circuit configuration of a bias generation circuit according to an embodiment.
Figure 2:
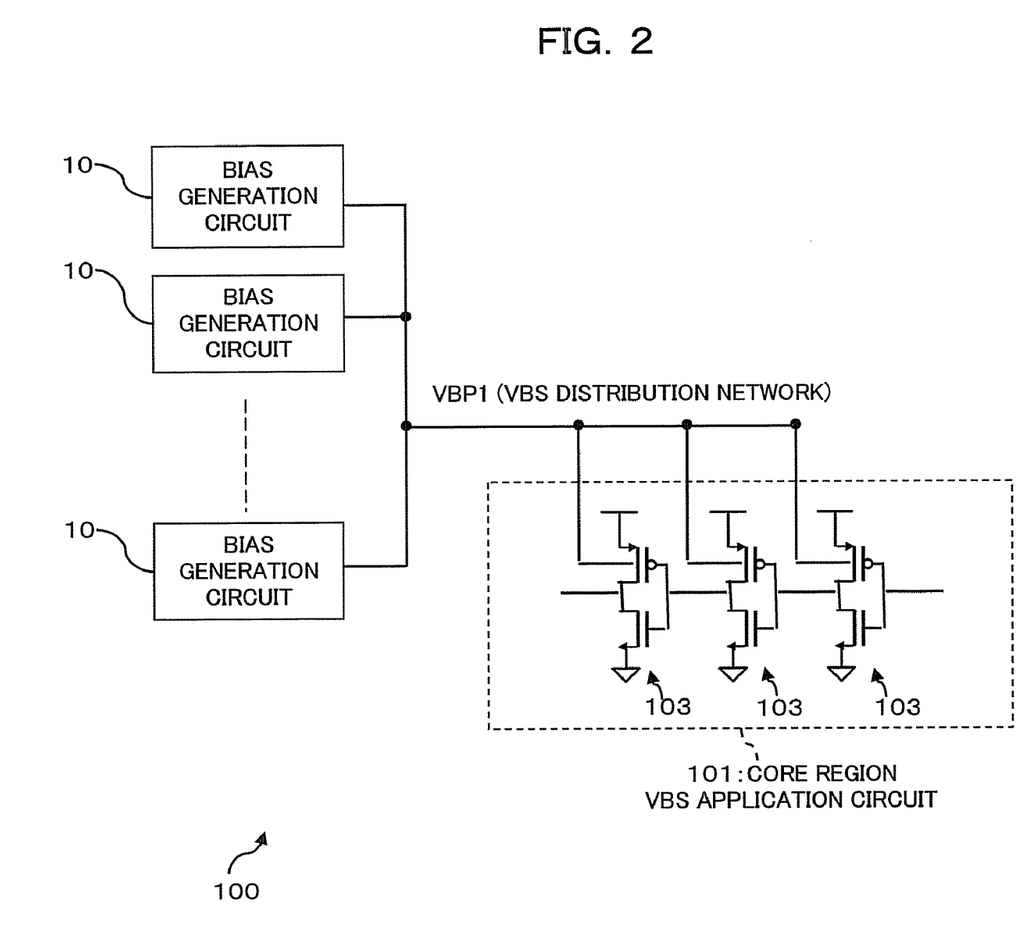
FIG. 2 is a diagram illustrating an example of output connection of the bias generation circuit in a semiconductor integrated circuit apparatus.
Figure 3:
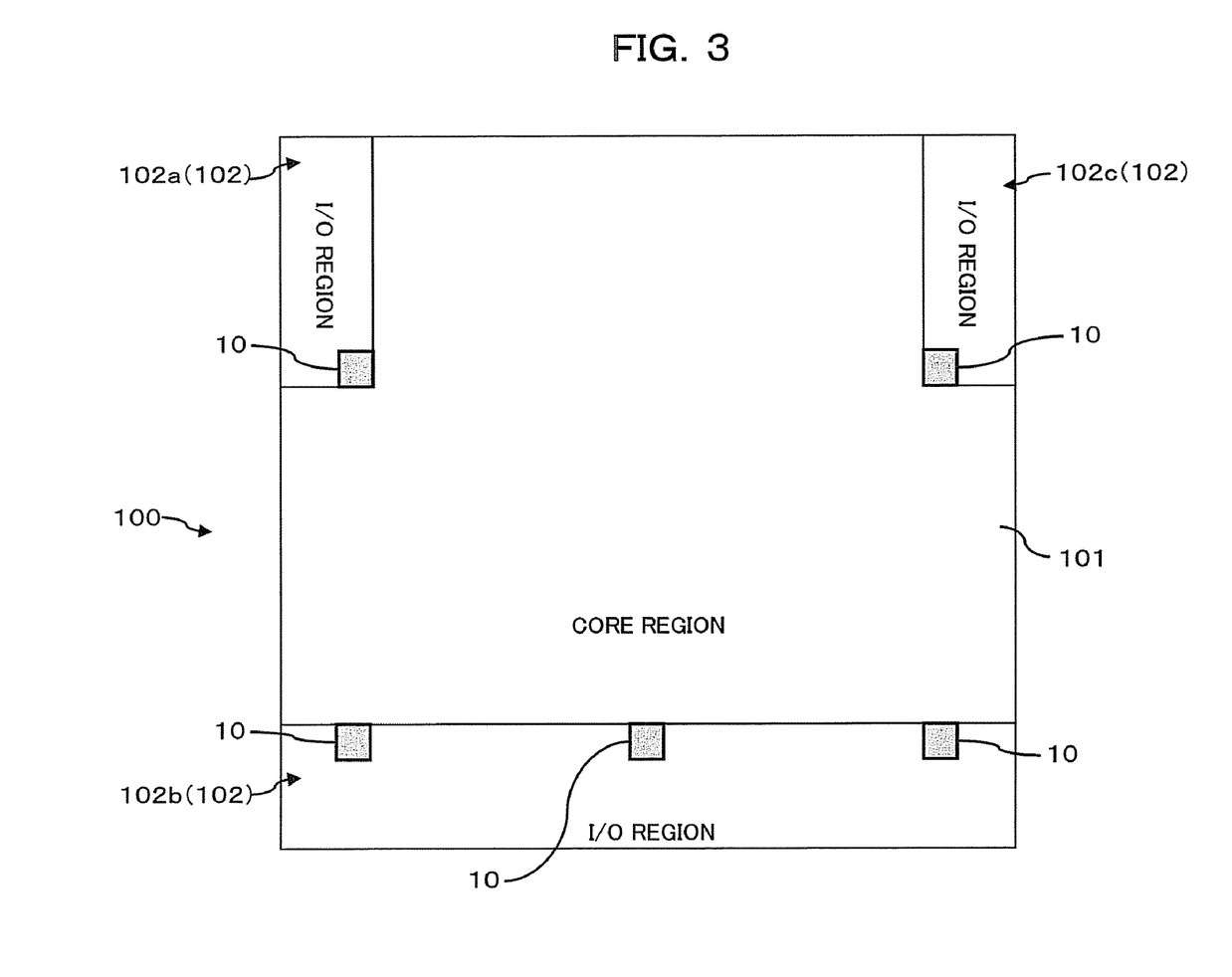
FIG. 3 is a diagram illustrating an example of arrangement of the bias generation circuit in the semiconductor integrated circuit apparatus.
Figure 4:
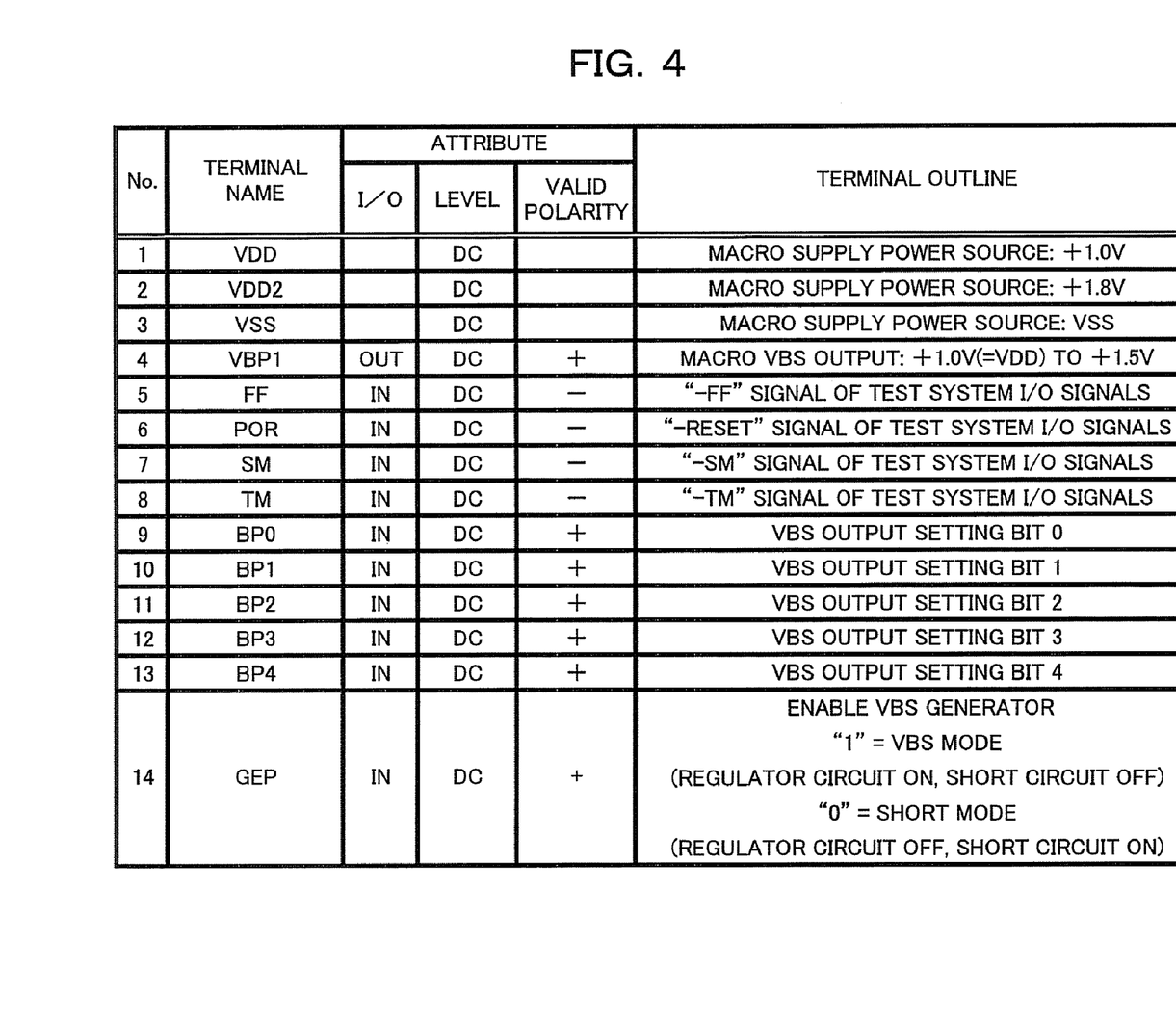
FIG. 4 is a diagram illustrating explanations of terminals in the bias generation circuit according to the embodiment as a list.

FIG. 1 is a diagram illustrating a circuit configuration of a bias generation circuit 10 according to an embodiment. FIG. 2 is a diagram illustrating an example of output connection of the bias generation circuit 10 in a semiconductor integrated circuit apparatus 100. FIG. 3 is a diagram illustrating an example of arrangement of the bias generation circuit 10. FIG. 4 is a diagram illustrating explanations of terminals of the bias generation circuit 10 as a list.

As illustrated in FIG. 2, the bias generation circuit 10 is provided to the semiconductor integrated circuit apparatus (LSI; semiconductor device) 100 to generate a back bias voltage VBS (substrate bias, reverse bias) to be connected and applied to a substrate of a PMOS transistor (transistor) 103 used in a core region 101 (see FIGS. 2 and 3) of the semiconductor integrated circuit apparatus 100.

In the example illustrated in FIG. 2, a plurality of the bias generation circuits 10 are connected in parallel and supply (apply) the back bias voltage VBS generated by these bias generation circuits 10 to a VBS application circuit (PMOS circuit) in the core region 101 via a VBS wiring network.

The semiconductor integrated circuit apparatus 100 having the bias generation circuits 10 is provided with, as illustrated in FIG. 3, a core region (first operation section) 101 and a plurality (three in the example illustrated in FIG. 3) of I/O (Input/Output) regions (second operation sections) 102a, 102b and 102c. In the I/O regions 101, 102b, 102c, I/O macro circuits (not depicted) and the like are formed, for example. In the core region 101, various logic circuits (not depicted) and the like are formed.

In the semiconductor integrated circuit apparatus 100, a core power supply voltage (first power supply voltage, macro supply power source) VDD (unit: V) is applied to the core region 101, whereas an I/O power supply voltage (second power supply voltage, macro supply power source) VDD2 (unit: V) higher than the core power supply voltage VDD is applied to each of the I/O regions 102a, 102b and 102c.

As illustrated in FIG. 3, the bias generation circuit 10 is formed in each of the I/O regions 102a, 102b and 102c in the semiconductor integrated circuit apparatus 100. In the example illustrated in FIG. 3, one bias generation circuit 10 is formed in each of the I/O regions 102a and 102c, whereas three bias generation circuits 10 are formed in the I/O region 102b.

Meanwhile, as reference character designating the I/O region, a reference character 102a, 102b or 102c is used when it is necessary to specify one of a plurality of the I/O regions, whereas a reference character 102 is used when an arbitrary I/O region is designated.

The bias generation circuit 10 is selectively operated in one of two operation modes, a VBS mode in which the bias generation circuit 10 generates and outputs an output voltage higher than the core power supply voltage VDD and lower than the I/O power supply voltage VDD2 as the back bias voltage VBS and a short mode in which the bias generation circuit 10 outputs an output voltage having the same potential with the core power supply voltage VDD as the back bias voltage VBS.

As illustrated in FIG. 1, the bias generation circuit 10 has a regulator circuit 11, a short circuit 12 and a switching circuit 13.

As illustrated in FIG. 4, the bias generation circuit 10 has input terminals VDD, VDD2, VSS, FF, POR, SM, TM, BP0 to BP4 and GEP, and an output terminal VBP1, and outputs the back bias voltage VBS from the output terminal VBP1.

To the input terminal GEP, selectively inputted is an operation mode control signal (Enable signal of VBS Generator) for determining the operation mode of the bias generation apparatus 10. When "1" is set at the input terminal GEP, the bias generation circuit 10 is operated in the VBS mode to turn on (valid) the function of the regulator circuit 11 and turn off (invalid) the function of the short circuit (details of which will be described later). When "0" is set at the input terminal GEP, the bias generator circuit 10 is operated in the short mode to turn off (invalid) the function of the regulator circuit 11 and turn on (valid) the function of the short circuit.

To the input terminal VDD (first power supply voltage input section), inputted is the core power supply voltage VDD (for example, +1.0V), which is the macro supply power source. To the input terminal VDD2 (second power supply voltage input section), inputted is the I/O power supply voltage VDD2 (for example, +1.8V), which is the macro supply power source. Further, to the input terminal VSS, inputted is a minus power source (for example, ground), which is the macro supply power source.

To the input terminal FF, "−FF" signal, which is a test system I/O signal, is inputted to be used in the accelerated test that accelerates generation of a fault or the like (Full Function), for example. To the input terminal POR, inputted is "−RESET" signal, which is the test system I/O signal. For example, a reset signal is inputted to the input terminal POR when power is applied to the semiconductor integrated circuit apparatus 100 (Power On Reset).

To the input terminal SM, inputted is "−SM" signal, which the test system I/O signal. For example, a Scan Mode signal at the time of diagnosis is inputted to the input terminal SM. To the input terminal TM, inputted is "−TM" signal, which is a test system I/O signal. For example, a Test Mode signal is inputted at the time of test to the input terminal TM. Incidentally, the valid polarity of these input terminals FF, POR, SM and TM is "−".

To the input terminals BP0 to BP4, set (inputted) are output setting bits for the back bias voltage VBS, details of which will be described later. To the input terminal GEP, inputted is an operation mode control signal (details of which will be described later).

The output terminal VBP1 (output section) outputs a macro VBS. The output terminal VBP1 outputs a back bias voltage VBS of +1.0V (=core power supply voltage VDD) to +1.5V, for example. Incidentally, the valid polarity of these input terminals BP0 to BP4 is "+", and attribute of levels of the input terminals and output terminals illustrated in FIG. 4 is DC (Direct Current).

The switching circuit (selector) 13 performs a switching control on the regulator circuit 11 and the short circuit 12 in order to set the operation mode of the bias generation circuit 10. The operation mode control signal ("0" or "1") is inputted via the input terminal GEP to the switching circuit 13. When "1" is inputted (set) to the input terminal GEP (VBS mode), the switching circuit 13 turns on (valid) the regulator circuit 11 and turns off (invalid) the short circuit 12. When "0" is set to the input terminal GEP (short mode), the switching circuit 13 turns off the regulator circuit 11 and turns on the short circuit 12 (details of which will be described later).

The switching circuit 13 has a first sequence control circuit 131, a second sequence control circuit 132 and an initial setting circuit 133. The switching circuit 13 performs a control to operate selectively either the regulator circuit 11 or the short circuit 12 on the basis of the operation mode control signal inputted to the input terminal GEP, hence the switching circuit 13 functions as a selector which can select either the core power supply voltage VDD or the back bias voltage VBS generated by the regulator circuit 11 as the output voltage.

In the example depicted in FIG. 1, the first sequence circuit 131 is represented as NOT circuit, while the second sequence circuit 132 is represented simply as amplifier circuit, and an output signal from the first sequence circuit 131 has an opposite phase to that of an output signal from the second sequence circuit 132.

The first sequence circuit 131 is connected to the short circuit 12 via a terminal GEPB, and an output signal from the first sequence circuit 131 is inputted to the short circuit 12 through the terminal GEPB. The second sequence circuit 132 is connected to the regulator circuit 11, and an output signal from the second sequence circuit 132 is inputted to the regulator circuit 11.

Each of the first sequence circuit 131 and the second sequence circuit 132 has a circuit (not depicted) for detecting ON/OFF of the power source of the semiconductor integrated circuit apparatus 100 to perform a control to turn on the short circuit 12 when detecting disconnection of the power source of the semiconductor integrated circuit apparatus 100.

The initial setting circuit 133 sets the short mode to the bias generation circuit 10 when the power is applied to the semiconductor integrated circuit apparatus 100. The initial setting circuit 133 inputs a rest signal POR when the power is applied to the semiconductor integrated circuit apparatus 100 to input "0" to the first sequence control circuit 131 and the second sequence control circuit 132.

The regulator circuit 11 generates the back bias voltage VBS on the basis of the I/O power supply voltage VDD2. As illustrated in FIG. 1, the regulator circuit 11 has a BGR (Band Gap Reference) bias circuit 112, a non-inverting amplifier circuit 113, a stable output circuit 114 and an initial setting circuit 115.

The BGR bias circuit (reference voltage generation circuit) 112 generates a reference voltage for generating the back bias voltage VDD2, to which the I/O power supply voltage VDD2 is inputted and to which an input terminal of a resistor R1 on the opposite side to a variable resistor VR is connected. The reference voltage generated by the BGR bias circuit 112 is inputted to a non-inverting input terminal (+) of an operational amplifier 1131.

The BGR bias circuit 112 is mounted on (integrated in) the bias generation circuit 10. The BGR bias circuit 112 can be configured with any one of various known BGR circuits.

The non-inverting amplifier circuit 113 amplifies the I/O power supply voltage VDD2 while maintaining the phase of the I/O power supply voltage VDD2, the non-inverting amplifier circuit 113 having the operational amplifier 1131, the resistor R1 and the variable resistor VR.

The I/O power supply voltage VDD2 is inputted to a power supply terminal of the operational amplifier 1131, and the reference voltage generated by the BGR bias circuit 112 is inputted to the non-inverting input terminal (+) of the same.

A point P1 between the resistor R1 and the variable resistor VR is connected to an inverting input terminal (−) of the operational amplifier 1131. An output terminal of the operational amplifier 1131 is inputted to a gate terminal of a PMOS driver (PMOS transistor) 1143 of the stable output circuit 114 to control ON/OFF of the PMOS driver 1143.

A voltage at the point P1 between the resistor R1 and the variable resistor VR is obtained by dividing the back bias voltage VBS outputted from the output terminal VBP1 by the resistor R1 and the variable resistor VR.

The resistor R1 and the variable resistor VR are resistors for setting the amplification degree of the non-inverting amplifier circuit 113. In the bias generation circuit 10, the amplification degree of the non-inverting amplifier circuit 113 is set according to a ratio of a resistance value of the resistor R1 to a resistance value of the variable resistor VR. In the example illustrated in FIG. 1, the resistance value of the resistor R1 is 100KΩ, while the resistance value of the variable resistor VR can be varied within a range from 10KΩ to 50KΩ.

The variable resistor VR is used to set a voltage of the back bias voltage VBS. In the bias generation circuit 10, the back bias voltage VBS can be arbitrary set by changing the resistance value of the variable resistor VR.

The resistance value of the variable resistor VR is determined by a combination of setting values (VBS output setting bits) of "ON (1)" or "OFF (0)" of the input terminals BP0 to BP4. Hereinafter, the setting value of the input terminal BP0 will be occasionally expressed as a VBS output setting bit 0, the setting value of the input terminal BP1 a VBS output setting bit 1, the setting value of the input terminal BP2 a VBS output setting bit 2, the setting value of the input terminal BP3 a VBS output setting bit 3, and the setting value of the input terminal BP4 a VBS output setting bit 4.

In the example illustrated in FIG. 1, the five input terminals BP0, BP1, BP 2, BP3 and BP4 are expressed as BP[0:4], for the sake of convenience.

Figure 5:
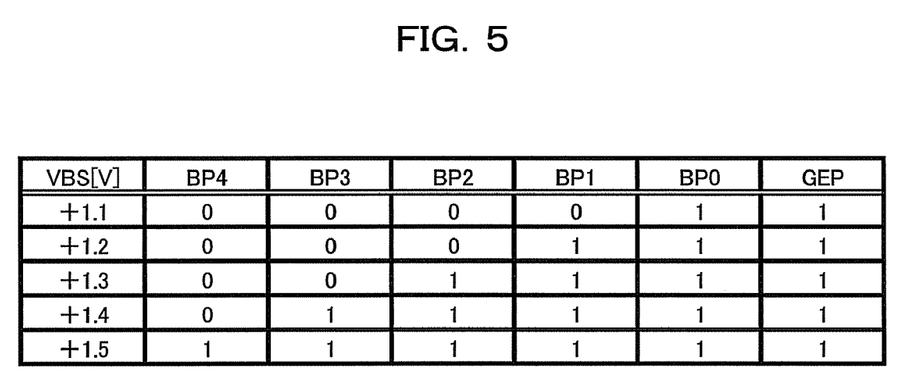
FIG. 5 is a diagram illustrating an example of relationship between VBS output setting bits and back bias voltage VBS at the time of VBS mode in the bias generation circuit according to the embodiment.

FIG. 5 is a diagram illustrating an example of relationship between the VBS output setting bits and the back bias voltage VBS at the time of VBS mode in the bias generation circuit 10.

In the example depicted in FIG. 5, the back bias voltage VBS can be arbitrary set to one value among five voltage values, +1.1, +1.2, +1.3, +1.4 and +1.5. For example, the back bias voltage set to +1.5V is outputted from the output terminal VBP1 by setting "1" to each of the input terminal GEP and the input terminals BP0 to BP4. Alternatively, the back bias voltage VBS of +1.2V is outputted from the output terminal VBP1 by setting "1" to the input terminal GEP and the input terminals BP0 and BP1, and "0" to the input terminals BP2 to BP4.

Further, the back bias generation circuit 10 can generate the back bias voltage VBS of +1.0V in the VSB mode. In the VBS mode, an operation mode in which the back bias voltage VBS of +1.0V is generated is specifically referred to as VBS emergency mode.

Figure 6:
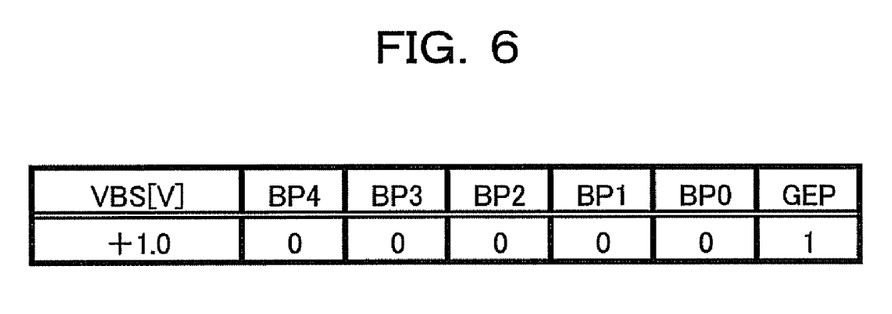
FIG. 6 is a diagram illustrating an example of relationship between the VBS output setting bits and the back bias voltage VBS in VBS emergency mode in the bias generation circuit according to the embodiment.

FIG. 6 is a diagram illustrating an example of relationship between the VBS output setting bits and the back bias voltage VBS in the VBS emergency mode of the bias generation circuit 10.

The bias generation circuit 10 can generate the back bias voltage VBS of +1.0V in the VBS, too. As illustrated in FIG. 6, the back bias voltage VBS set to +1.0V is outputted from the output terminal VBP1 by setting "1" to the input terminal GEP and "0" to each of the input terminals BP0 to BP4, for example.

The initial setting circuit 115 initializes the variable resistor VR by inputting a reset signal POR when the power is applied to the semiconductor integrated circuit apparatus 100, thereby to stabilize the operation of the semiconductor integrated circuit apparatus 100 when the power is applied to the semiconductor integrated circuit apparatus 100. For example, the initial setting circuit 115 makes the semiconductor integrated circuit apparatus 100 output the bias voltage VBS=+1.0V as the VBS emergency mode when the power is applied to the semiconductor integrated circuit apparatus 100 or when the short circuit to be described later does not work well.

The stable output circuit 114 stably outputs the output voltage generated by the regulator circuit 11. The stable output circuit 114 has a PMOS driver 1143, transistors 1141 and 1142, and a resistor RD.

To a gate of the PMOS driver 1143, inputted is an inverted output signal from the operational amplifier 1131 of the non-inverting amplifier circuit 113. The I/O power supply voltage VDD2 is connected to a source of the PMOS driver 1143, while an output terminal VBP1 is connected to a drain of the same.

Between the gate of the PMOS driver 1143 and the I/O power supply voltage VDD2, disposed is the transistor 1142 whose drain is inverted and inputted to the gate of the PMOS driver 1143. To a source of the transistor 1142, inputted is the I/O power supply voltage VDD2.

Further, between the gate of the PMOS driver 1143 and the core power supply voltage VDD, disposed is the transistor 1141 whose drain is inverted and inputted to the gate of the PMOS driver 1143. To a gate of the transistor 1141, the I/O power supply voltage VDD2 inverted is inputted. Further, to a source of the transistor 1141, inputted is the core power supply voltage VDD.

The I/O power supply voltage VDD2 is inputted to a body of the transistor 1141 and a body of the PMOS driver 1143 via the resistor RD.

When the I/O power supply voltage VDD2 is suddenly turned off while the back bias voltage VBS is supplied from the bias generation circuit 10 to the PMOS transistor or the like, for example, the PMOS transistor 103 to which the back bias voltage VBS is being applied is protected by turning on the transistor 1141 to turn off the PMOS driver 1143.

When an OFF signal is inputted to the stable output circuit 114 from the first sequence circuit 131 in the switching circuit 13 to be described later, the PMOS driver 1143 is turned off by turning on the transistor 1142.

On the other hand, when an ON signal is inputted to the stable output circuit 114 from the first sequence circuit 131 in the switching circuit 13 to be described later, the back bias voltage VBS generated by the regulator circuit 11 is outputted to the output terminal VBP1.

The short circuit 12 short-circuits the VBS output to the core power supply voltage VDD to equalize potentials of the back bias voltage VBS and the core power supply voltage VDD. As illustrated in FIG. 1, the short circuit 12 has transistors STP1, FHP1 and FHN1.

The short circuit 12 is connected to the first sequence control circuit 131 in the switching circuit 13 via a terminal GEPB. A signal inputted from the terminal GEPB is inputted to a gate of the transistor FHN1, while the signal whose phase has been inverted is inputted to a gate of the transistor FHP1.

In the short circuit 12, the terminal GEPB has an attribute of input (IN), and an attribute that the level is DC and the valid polarity is "+". To the terminal GEPB, inputted is a control signal for switching on/off the short mode. A signal obtained by inverting the phase of the operation mode control signal inputted to the input terminal GEP is inputted as the control signal.

The transistor STP1 has a function of short-circuiting the core power supply voltage VDD to the output terminal VBP1. The transistor STP1 is configured as a transistor type of STD PMOS (3Well) for example.

The transistor FHP1 has a function of turning off the transistor STP1 at the time of the VBS mode. The transistor FHP1 is configured as a transistor type of FH PMOS (3Well). The transistor FHN1 has a function of turning on the transistor STP1 at the time of the short mode. The transistor FHN1 is configured as a transistor type of FH NMOS (3Well), for example.

Figure 7:
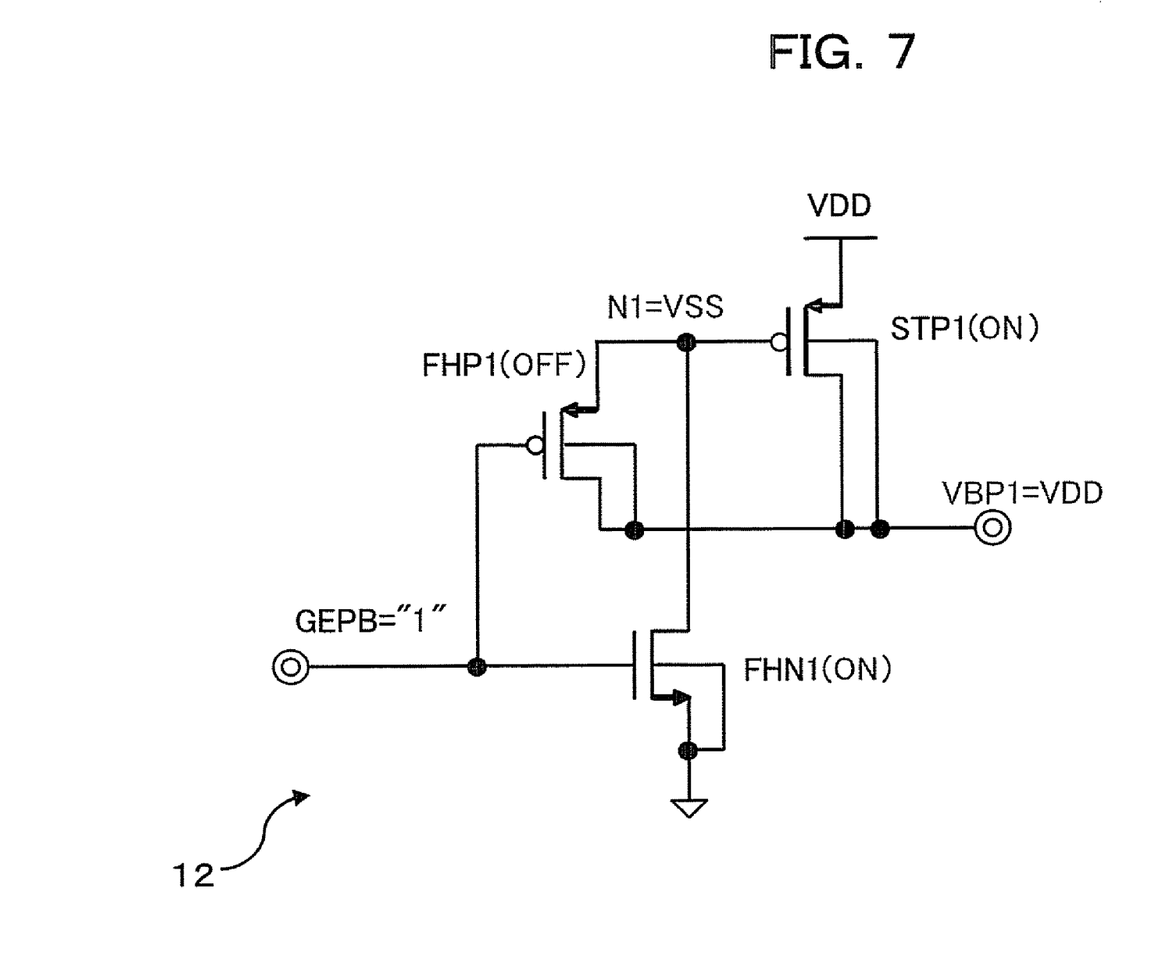
FIG. 7 is a diagram illustrating a circuit in order to illustrate an operation of a short circuit in the bias generation circuit according to the embodiment.
Figure 8:
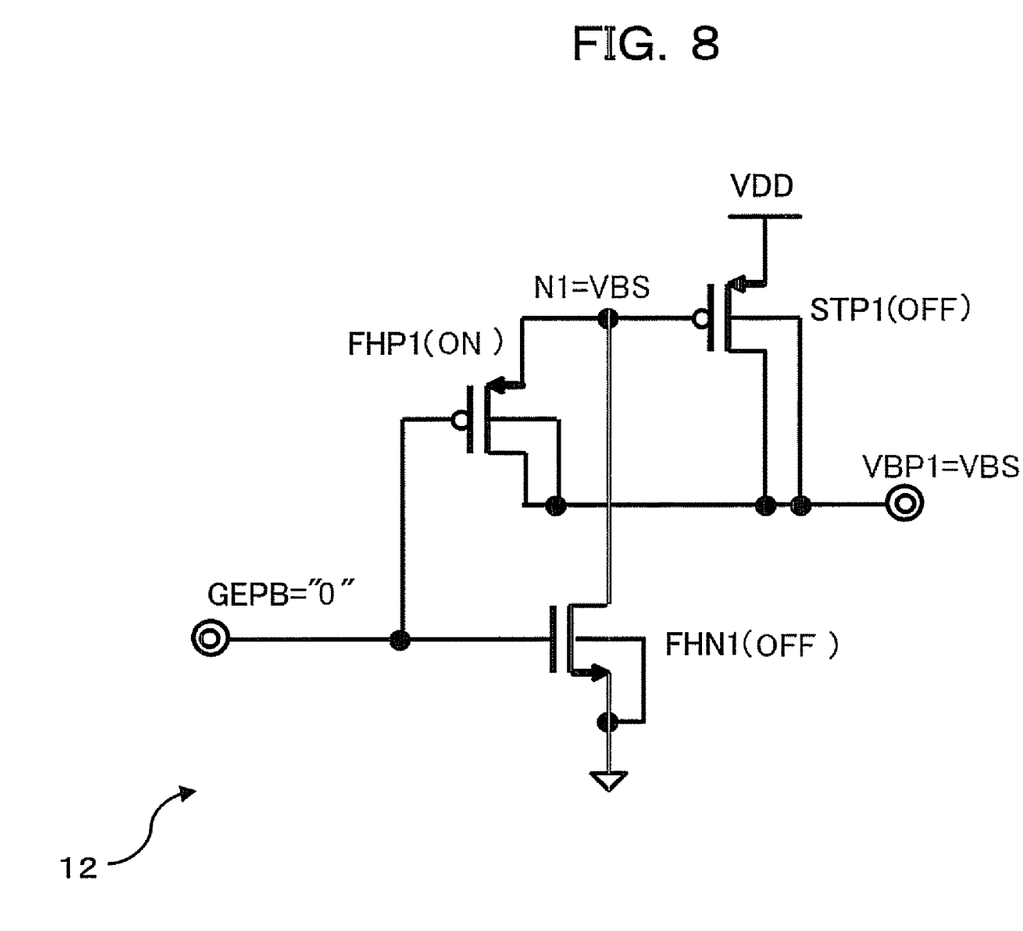
FIG. 8 is a diagram illustrating the circuit in order to illustrate another operation of the short circuit in the bias generation circuit according to the embodiment.
Figure 9:
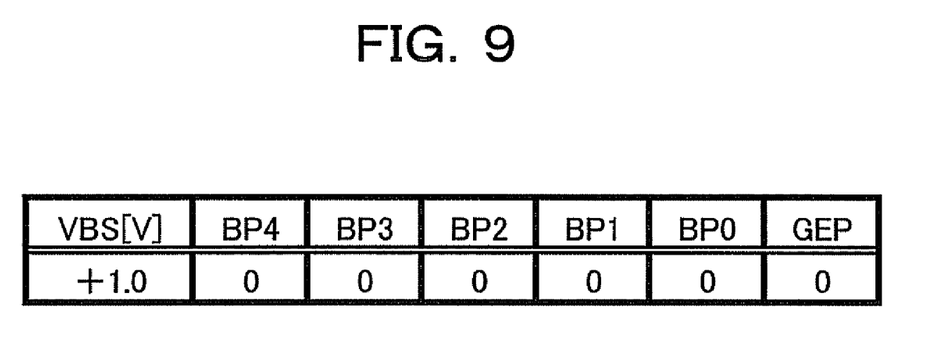
FIG. 9 is a diagram illustrating an example of relationship between the VBS output setting bits and the back bias voltage VBS at the time of short mode in the bias generation circuit according to the embodiment.

FIGS. 7 and 8 are diagrams illustrating operations of the short circuit 12 in the bias generation circuit 10 according to an embodiment. FIG. 7 illustrates an operation of the short circuit 12 in the short mode, whereas FIG. 8 illustrates an operation of the same in the VBS mode. FIG. 9 is a diagram illustrating an example of relationship between the VBS output setting bits and the back bias voltage VBS at the time of the short mode in the bias generation circuit 10.

In the bias generation circuit 10, the short circuit 12 is operated when the potential of the back bias voltage VBS is made equal to that of the core power supply voltage VDD. In the short mode in which the short circuit 12 is operated as above, "0" is set to the input terminal GEP, as illustrated in FIG. 9.

In the short mode, the switching circuit 13 stops the regulator circuit 11.

When the operation mode control signal "0" is set to the input terminal GEP in the short mode, the operation mode control signal is inverted in the first sequence circuit 131 of the switching circuit 13, and "1" is set to the terminal GEPB in the short circuit 12, as illustrated in FIG. 7.

Whereby, "0" is set to the gate of the transistor FHP1 to turn off the transistor FHP1, while "1" is set to the gate of the transistor FHN1 to turn on the transistor FHN1.

The transistor FHN1 decreases the gate voltage of the transistor STP1 to VSS (see point N1) to turn on the transistor STP1, hence the voltage at the output terminal VBP1 becomes +1.0V which is equal to the core power supply voltage VDD.

On the other hand, at the time of the VBS mode, the operation mode control signal "1" is set to the input terminal GEP, the operation mode control signal is inverted in the first sequence circuit 131 of the switching circuit 13, and "0" is set at the terminal GEPB in the short circuit 12, as illustrated in FIG. 8.

Whereby, "1" is set to the gate of the transistor FHP1 to turn on the transistor FHP1, while "0" is set to the gate of the transistor FHN1 to turn off the transistor FHN1.

The transistor FHN1 equalizes the gate voltage of the transistor STP1 to the source voltage (VBS) of the transistor STP1 to turn off the transistor STP1. Namely, it is possible to prevent supply of the core power supply voltage VDD to the output terminal VBP1 with certainty to improve the reliability against high voltage.

Next, a process after the power is applied in the bias generation circuit 10 having the above configuration according to the embodiment will be described with reference to timing charts illustrated in FIGS. 10 and 11.

Figure 10:
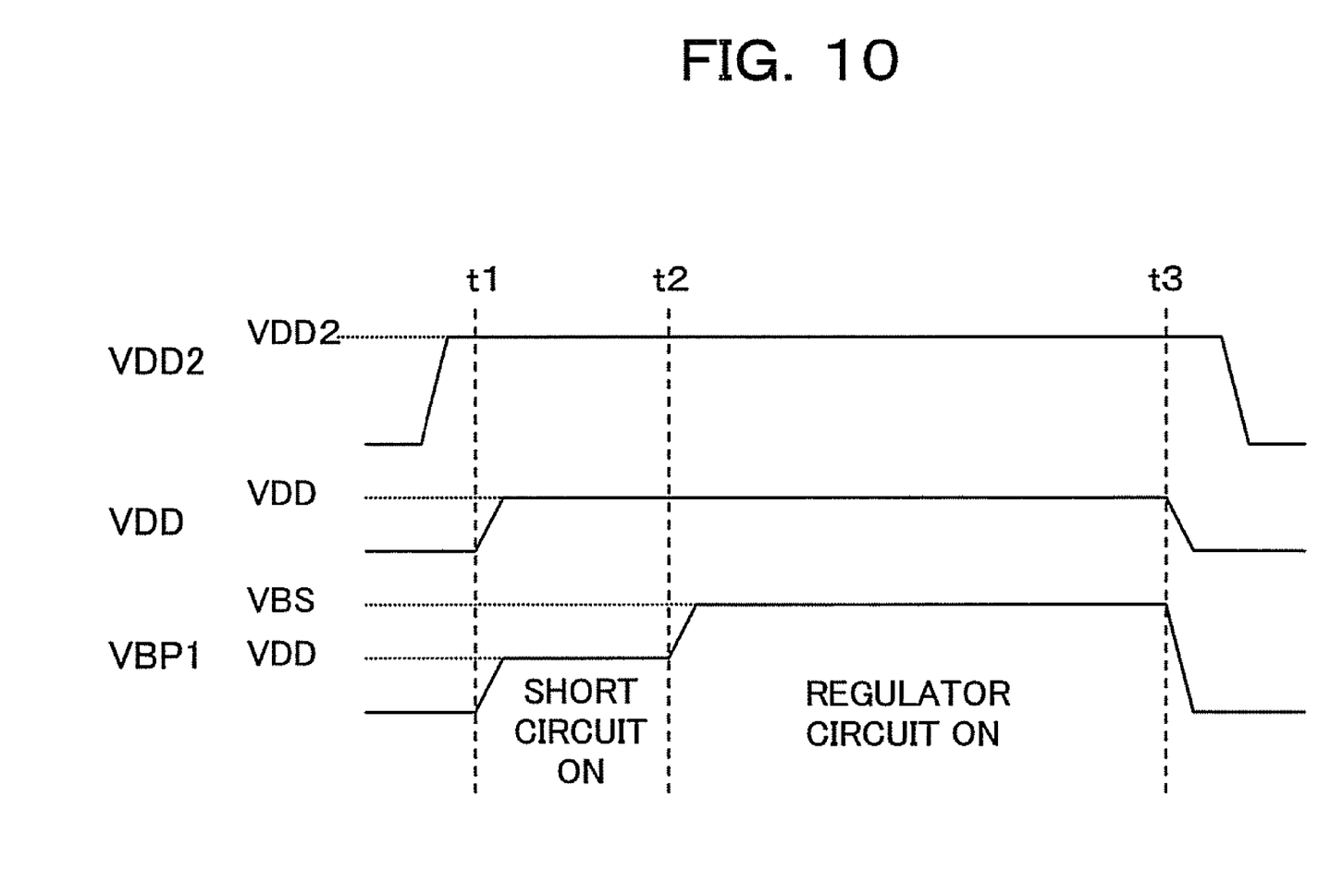
FIG. 10 is a timing chart for illustrating a process after power is applied to the bias generation circuit according to the embodiment.

FIG. 10 is a diagram illustrating an example where the I/O power supply voltage VDD2 is applied earlier in the semiconductor integrated circuit apparatus 100. FIG. 11 is a diagram illustrating an example where the core power supply voltage VDD is applied earlier in the semiconductor integrated circuit apparatus 100.

When the back bias voltage VBS higher than the core power supply voltage VDD is outputted from the output terminal VBP1 by the bias generation circuit 10 (input terminal GEP="1"; VBS mode), a setting that matched a voltage of a desired back bias voltage VBS is done on the input terminals BP0 to BP4 as needed (see FIG. 5).

In this embodiment, the semiconductor integrated circuit apparatus 100 has two power sources, the core power supply voltage VDD and the I/O power supply voltage VDD2. However, there is a fear that it can not tell whether the core power supply voltage VDD or the I/O power supply voltage VDD2 becomes the ON state earlier.

In order to uniquely determine the value of the back bias voltage VBS in the bias generation circuit 10, the short circuit 12 is turned on when the power is applied or before the substrate bias is set.

When the I/O power supply voltage VDD2 is turned on earlier, the core power supply voltage VDD is turned on later than the I/O power supply voltage VDD2 as illustrated in FIG.

10. The switching circuit 13 turns off the regulator circuit 11 on the basis of the operation mode control signal set to the input terminal GEP while turning on the short circuit 12 the instant the core power supply voltage VDD is applied (see time t1).

The setting of the variable resistor VR is performed on the basis of the setting of the input terminals BP0 to BP4. After the bias setting is performed (see time t2), the regulator circuit 11 is operated to output a desired back bias voltage VBS to the output terminal VBP1.

The regulator circuit 11 generates a predetermined back bias voltage VBS on the basis of the I/O power supply voltage VDD 2, and outputs the back bias voltage VBS from the output terminal VBP1.

When the back bias voltage VBS having the same potential as the core power supply voltage VDD is outputted from the output terminal VBP1 (input terminal GEP="0"; short mode), the switching circuit 13 turns off the regulator circuit 11 while turning on the short circuit 12 on the basis of the operation mode control signal inputted to the input terminal GEP.

In the short circuit 12, the core power supply voltage VDD is connected to the output terminal VBP1 by turning on the transistor STP1, hence the core power supply voltage VDD is outputted from the output terminal VBP1.

When the power is disconnected, the core power supply voltage VDD is turned off (see time t3), whereby the back bias voltage VBS is turned off, thereafter, the I/O power supply voltage VDD2 is turned off.

Figure 11:
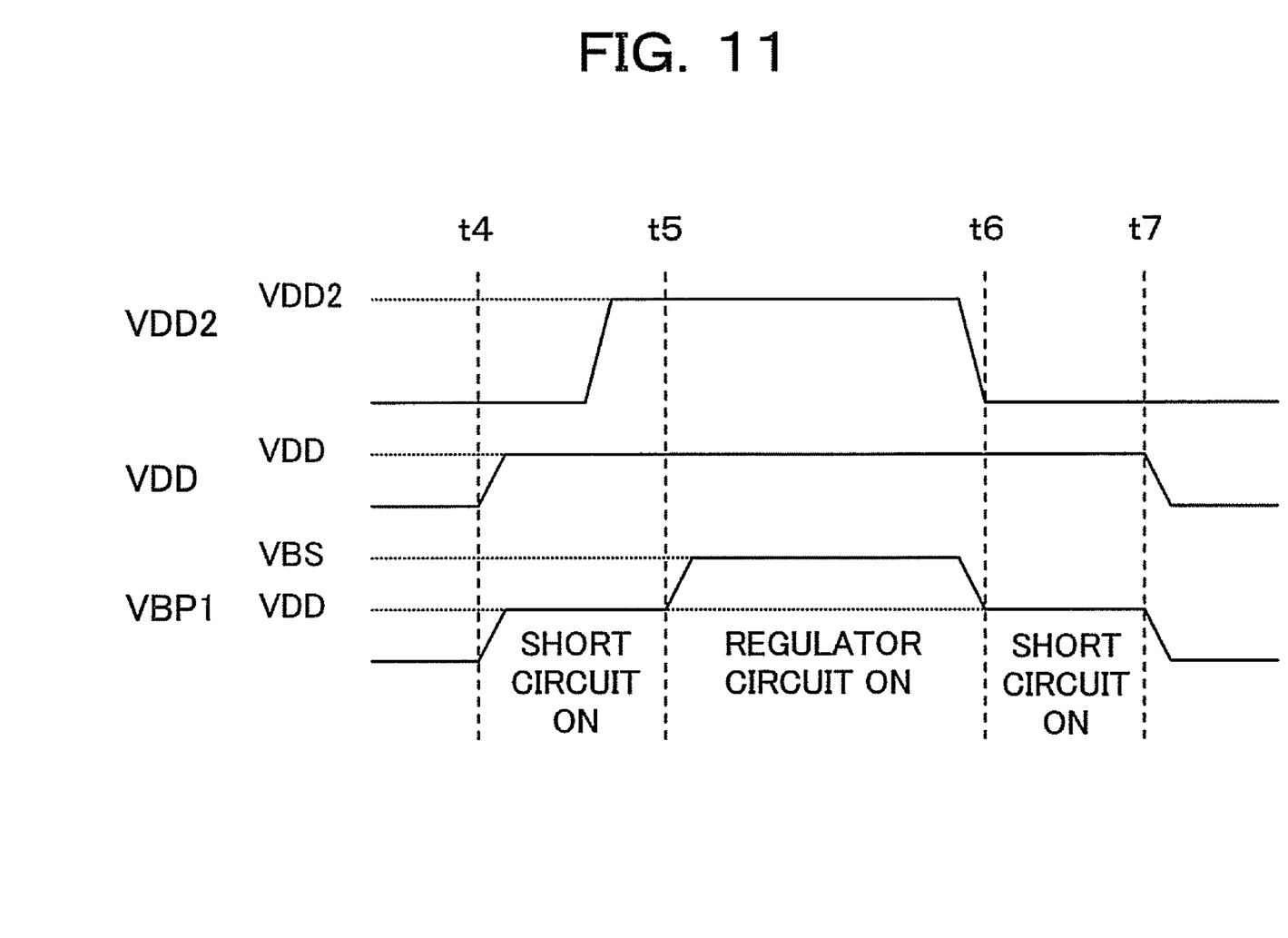
FIG. 11 is a timing chart for illustrating another process after the power is applied to the bias generation circuit according to the embodiment.

On the other hand, when the core power supply voltage VDD is turned on earlier, the switching circuit 13 turns off the regulator circuit 11 while turning on the short circuit 12 on the basis of the operation mode control signal set to the input terminal GEP the instant the core power supply voltage VDD is applied, as illustrated in FIG. 11 (see time t4). The I/O power supply voltage VDD2 is turned on later than the core power supply voltage VDD.

The variable resistor VR is set on the basis of the setting of the input terminals BP0 to BP4, and the bias setting is performed (see time t5). Thereafter, the regulator circuit 11 is operated to output a desired back bias voltage VBS to the output terminal VBP1.

The regulator circuit 11 generates a predetermined back bias voltage VBS on the basis of the I/O power supply voltage VDD2, and outputs the back bias voltage VBS from the output terminal VBP1.

When the back bias voltage VBS having the same potential as the core power supply voltage VDD is outputted from the output terminal VBP1 (input terminal GEP="0"; short mode), the switching circuit 13 turns off the regulator circuit 11 while turning on the short circuit 12 on the basis of the operation mode control signal inputted to the input terminal GEP.

In the short circuit 12, the core power supply voltage VDD is connected to the output terminal VBP1 by turning on the transistor STP1, hence the core power supply voltage VDD is outputted from the output terminal VBP1.

When only the I/O power supply voltage VDD2 is turned off while the regulator circuit 11 is operated, the core power supply voltage VDD is applied to the source of the PMOS, which causes floating of the substrate (not depicted) on which the PMOS is formed.

In order to avoid such state, in this embodiment, the I/O power supply voltage VDD2 is first turned off and the state is moved into the short mode while the core power supply voltage VDD is kept in the on state when the power is disconnected (see time t6), thereafter, the core power supply voltage VDD is turned off (see time t7).

As stated above, since the bias generation circuit 10 according to the embodiment generates the back bias voltage VBS by means of the regulator circuit 11, it is possible to attain the back bias voltage VBS with lower power consumption and accomplish the circuit of small circuit scale without a clock.

As compared with a clock application type boost charge pump, this embodiment is superior in supply current relative to the substrate leak current, and can cope with large scale LSI with smaller circuit scale.

Since the embodiment provides the short circuit 12 and the switching circuit 13 switching the regulator circuit 11 to/from the short circuit 12, it is possible to output the core power supply voltage VDD as the back bias voltage VBS via the short circuit 12 when the I/O power supply voltage VDD2 is turned off, thereby to stably operate the transistor to which the back bias voltage VBS is applied.

In the semiconductor integrated circuit apparatus 100, by applying the back bias voltage VBS to a substrate of the transistor, it is possible to reduce the leak current of the transistor.

Since the bias generation circuit 10 is built in the semiconductor integrated circuit apparatus 100, it is unnecessary to provide extra bias generation circuit outside the semiconductor integrated circuit apparatus 100. This can reduce the fabrication cost, and can remove hardware limitation to form the bias generator apparatus, which improves the degree of freedom in design.

For example, even when the I/O power supply voltage VDD2 is suddenly turned off while the back bias voltage VBS is supplied from the bias generation circuit 10 to the PMOS transistor or the like, the stable output circuit 114 can turn on the transistor 1141 to turn off the PMOS driver 1143, thereby to protect the PMOS transistor to which the back bias voltage VBS is applied and let the PMOS transistor to stably operate.

To provide the PMOS driver 1143 to the regulator circuit 11 makes it possible to obtain sufficient current at the output terminal VBP1.

Further, since the BGR bias circuit 112 generating the reference voltage used when the back bias voltage VBS is generated is provided in the bias generation circuit 10, it is unnecessary to separately provide an apparatus or the like for generating the reference voltage outside the bias generation circuit 10. Therefore, it is possible to reduce the fabrication cost, to remove the hardware limitation caused by that the bias generation apparatus is disposed, and to improve the degree of freedom in design.

The present embodiment provides at least one of the following effects or advantages:

(1) The regulator circuit generates a back bias voltage on the basis of the second power supply voltage, and the back bias voltage generated by the regulator circuit is outputted as the output voltage. This makes it possible to realize the back bias voltage with low power consumption, and accomplish the circuit of small circuit scale.

(2) The bias generation circuit has a reference voltage generation circuit generating a reference voltage to be a reference in generating the back bias voltage. Therefore, it is unnecessary to separately provide an apparatus or the like to generate the reference voltage outside the bias generation circuit. In addition, it is possible to reduce the fabrication cost, to remove hardware limitation in providing the bias generation apparatus, and improve the degree of freedom in design.

(3) A selector can select either the first power supply voltage or the back bias voltage generated by the regulator circuit as the output voltage, and either the back bias voltage or the first power supply voltage selected by the selector can be outputted as the output voltage. Therefore, a transistor to which the back bias is applied can be stably operated.

(4) The first power supply voltage is outputted as the output voltage when power is applied to the semiconductor device. Therefore, the transistor to which the back bias voltage is applied can be stably operated.

(5) Since the regulator circuit comprises a PMOS driver, sufficient current can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A semiconductor device having a first operation section operable at a first power supply voltage, a second operation section operable at a second power supply voltage differing from the first power supply voltage and a bias generation circuit, the bias generation circuit comprising:
    a first power supply voltage input section that inputs the first power supply voltage;
    a second power supply voltage input section that inputs the second power supply voltage;
    a regulator circuit that generates a back bias voltage on the basis of the second power supply voltage, the back bias voltage being varied in accordance with a combination of bit values inputted to the regulator circuit;
    a selector that selects either the first power supply voltage or the back bias voltage generated by the regulator circuit as an output voltage;
    an output section that outputs the output voltage; and
    a short circuit that short-circuits the back bias voltage to the first power supply voltage to equalize potentials of the back bias voltage and the first power supply voltage,
    wherein the regulator circuit is turned off and the short circuit is turned on when power is applied to the semiconductor integrated circuit apparatus or when a source of the second power supply voltage is tuned off while the regulator circuit operates, and
    when the second voltage source is turned on before the first voltage source is turned on in response to the semiconductor device being switched on, the second power supply voltage is turned off, the short circuit is turned on, and the regulator circuit is turned off in response to the semiconductor device being switched off while the first power supply voltage is maintained on, and thereafter the first power supply voltage is turned off.

2. The semiconductor device according to claim 1, wherein the bias generation circuit further comprises a reference voltage generation circuit that generates a reference voltage to be a reference in generating the back bias voltage.

3. The semiconductor device according to claim 1, wherein the selector selects the first power supply voltage as the output voltage in the bias generation circuit when power is applied to the semiconductor device.

4. The semiconductor device according to claim 1, wherein the regulator circuit comprises a PMOS driver.

5. A bias generation circuit provided in a semiconductor device and generating a back bias voltage to be applied to a transistor in the semiconductor device, the bias generation circuit comprising:
    a first power supply voltage input section that inputs a first power supply voltage;
    a second power supply voltage input section that inputs a second power supply voltage differing from the first power supply voltage;
    a regulator circuit that generates the back bias voltage on the basis of the second power supply voltage, the back bias voltage being varied in accordance with a combination of bit values inputted to the regulator circuit; a selector that selects either the first power supply voltage or the back bias voltage generated by the regulator circuit as an output voltage;
    an output section that outputs the output voltage; and
    a short circuit that short-circuits the back bias voltage to the first power supply voltage to equalize potentials of the back bias voltage and the first power supply voltage,
    wherein the regulator circuit is turned off and the short circuit is turned on when power is applied to the semiconductor integrated circuit apparatus or when a source of the second power supply voltage is tuned off while the regulator circuit operates, and
    wherein, when the second voltage source is turned on before the first voltage source is turned on in response to the semiconductor device being switched on, the second power supply voltage is turned off, the short circuit is turned on, and the regulator circuit is turned off while the first power supply voltage is maintained on in response to the semiconductor device being switched off, and thereafter the first power supply voltage is turned off.

6. The bias generation circuit according to claim 5 further comprising a reference voltage generation circuit that generates a reference voltage to be a reference in generating the back bias voltage.

7. The bias generation circuit according to claim 5, wherein the selector selects the first power supply voltage as the output voltage when power is applied to the semiconductor device.

8. The bias generation circuit according to claim 5, wherein the regulator circuit comprises a PMOS driver.

9. The semiconductor device according to claim 1, wherein the regulator circuit comprises a variable resistor.

10. The semiconductor device according to claim 9, wherein the regulator circuit varies the generated back vias voltage by changing a resistance of the variable resistor in accordance with the combination of bit values.

11. The semiconductor device according to claim 1, wherein the back bias voltage is switched to the first power supply voltage when a source of the second power supply voltage is disabled while the regulator circuit operates.

12. The bias generation circuit according to claim 5, wherein the regulator circuit comprises a variable resistor.

13. The bias generation circuit according to claim 12, wherein the regulator circuit varies the generated back vias voltage by changing a resistance of the variable resistor in accordance with the combination of bit values.

14. The bias generation circuit according to claim 5, wherein the back bias voltage is switched to the first power supply voltage when a source of the second power supply voltage is disabled while the regulator circuit operates.

* * * * *